United States Patent [19]

Derby

[11] 4,259,642
[45] Mar. 31, 1981

[54] REPEATER FEEDBACK CIRCUIT

[75] Inventor: Jeffrey H. Derby, New York, N.Y.

[73] Assignee: Bell Telephone Laboratories, Incorporated, Murray Hill, N.J.

[21] Appl. No.: 974,379

[22] Filed: Dec. 29, 1978

[51] Int. Cl.³ ............................................. H03F 3/68
[52] U.S. Cl. .................................. 330/288; 330/290; 330/295
[58] Field of Search ............... 330/288, 290, 291, 295; 307/299 B

[56] References Cited

U.S. PATENT DOCUMENTS

| 3,233,125 | 2/1966 | Buie | 330/290 X |
| 3,717,821 | 2/1973 | Amemiya et al. | 330/288 X |
| 3,822,387 | 7/1974 | Mulder | 307/299 B |
| 3,921,091 | 11/1975 | Van Kessel et al. | 330/254 |
| 3,956,645 | 5/1976 | Boer | 307/297 X |
| 4,030,042 | 6/1977 | Limberg | 330/288 |
| 4,105,943 | 8/1978 | Krause | 330/290 |
| 4,168,528 | 9/1979 | Comer | 330/257 X |
| 4,172,999 | 10/1979 | Leidich | 330/257 |

OTHER PUBLICATIONS

Bilotti, "Noise Characteristics of Current Mirror Sinks/Sources", IEEE Journal of Solid-State Circuits, vol. 10, No. 6, Dec. 1975, pp. 516-524.

Primary Examiner—James B. Mullins
Attorney, Agent, or Firm—Robert O. Nimtz

[57] ABSTRACT

A bilateral transmission line repeater is disclosed in which opposite directions of transmission are separated into different frequency bands. The amplifiers for each direction of transmission include an automatic gain control circuit for controlling the gain of the amplifier. Gain control for the inward bound amplifier (toward a central location such as a telephone central office) is under the control of an automatic gain control signal derived from the outward bound signal as well as from the inward bound signal. Feedback around the gain control amplifier is accomplished using a current mirror circuit to avoid loading the amplifier output.

2 Claims, 1 Drawing Figure

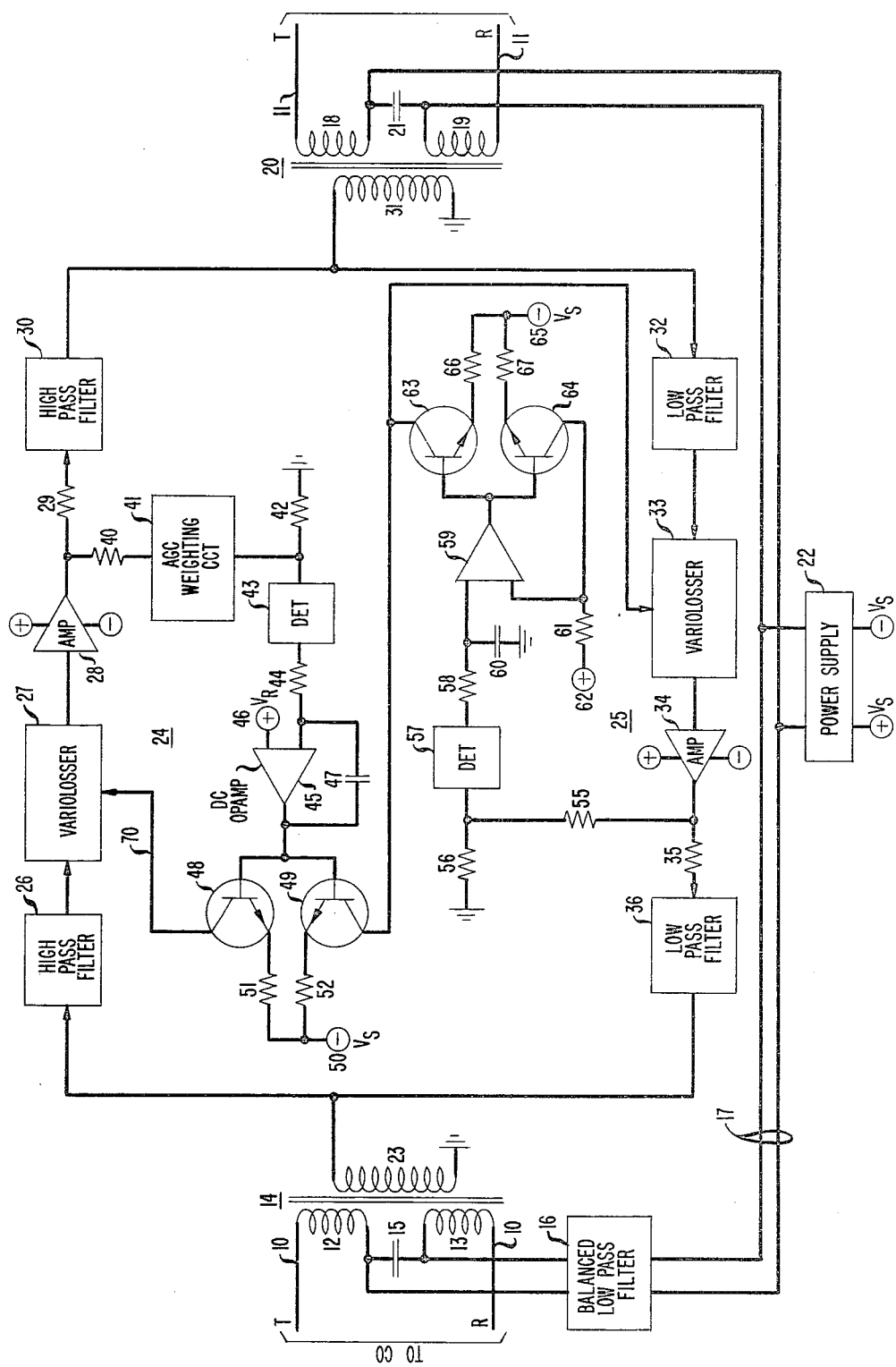

REPEATER FEEDBACK CIRCUIT

BACKGROUND OF THE INVENTION

1. Field of the Invention

This invention relates to amplification circuits and, more particularly, to feedback arrangements for such amplification circuits.

2. Description of the Prior Art

The use of feedback in signal amplifiers is well known to control the linearity and signal level of the output signal. In order to provide signal feedback, it has been necessary to connect a signal sensing circuit to the output of the amplifier and then feed the derived or sensed signal back to the amplifier input. Such sensing circuits constitute a load on the amplifier output which makes the feedback signal sensitive to the amplifier output level and may introduce frequency sensitivities in the feedback signal. Moreover, the need to supply the feedback signal as well as the output signal from the amplifier increases the requirements for amplifier gain and level handling capacity. These disadvantages become particularly acute when amplifiers are fabricated in integrated circuit form where size and frequency dependencies become especially critical.

SUMMARY OF THE INVENTION

In accordance with the illustrative embodiment of the present invention, current feedback for an amplifier circuit is derived by means of a current mirror circuit connected to the output of the amplifier. The current mirror circuit in transistor form merely comprises two identical transistors driven by the same output signal from the amplifier. Each separate transistor can therefore be separately loaded without affecting the gain or signal level from the other transistor. It is therefore possible to use one transistor output as the amplifier output and the other transistor output as the feedback signal. The current mirror isolates the feedback signal from the amplifier output signal sufficiently to permit a direct connection of the feedback signal to the amplifier input.

The current mirror feedback arrangements of the present invention simplify the fabrication of feedback amplifiers in integrated circuit form since fewer components are required and the signal levels in each component are reduced.

BRIEF DESCRIPTION OF THE DRAWING

The single FIGURE of the drawing shows a detailed block diagram of a bilateral repeater having automatic gain control circuits using the current mirror feedback arrangements of the present invention.

DETAILED DESCRIPTION

In the drawing there is shown a detailed block diagram of a bilateral repeater connected between an inward bound transmission line 10 and an outward bound transmission line 11. Since the arrangements of the present invention are particularly suitable for use in subscriber loop carrier systems, the transmission lines 10 and 11 are shown as telephone conductor pairs having tip and ring conductors labeled T and R, respectively, in the drawing. Transmission line conductors 10 are connected across the primary windings 12 and 13 of transformer 14.

The repeater of the drawing is energized by direct current electrical power impressed on conductors 10 either at the central office location or at some remote powering station. A capacitor 15 separates windings 12 and 13 for direct currents. The direct current voltage on conductors 10 is applied through a low-pass filter 16 to bypass conductors 17 which connect to outward bound transmission line conductors 11 through windings 18 and 19 of transformer 20. Windings 18 and 19 are separated by a capacitor 21 to maintain the direct current isolation. A local power supply 22 is connected across bypass conductors 17 and translates the direct current supplied on transmission line 10 or 11 to voltage levels suitable for operating the electronic circuits in the balance of the drawing.

The secondary winding 23 of transformer 14 is connected to two transmission paths 24 and 25, one for each direction of transmission. Outward bound transmission path 24 includes a high-pass filter 26 which separates the outward bound signals from the inward bound signals by having a passband which accommodates only the outward bound signal frequency band. The output of filter 26 is applied to a variolosser circuit 27 which attenuates the signal level of signals passing therethrough in response to a control signal on lead 70. The output of variolosser 27 is applied to the input of outward bound amplifier 28 which amplifies the signal and applies it through resistor 29 to a high-pass separation filter 30. The output of filter 30 is connected to the secondary winding 31 of transformer 20.

Winding 31 is likewise connected to both outward bound transmission path 24 and to inward bound transmission path 25. That is, transformer 31 is connected to low-pass separation filter 32 which serves to separate the inward bound carrier frequency band from the outward bound carrier signals by having a passband which discriminates in favor of the lower frequency inward bound carrier signals. The output of filter 32 is applied to a variolosser 33, serving a function for the inward bound path 25 similar to the function of variolosser 27 in the outward bound path 24. The output of variolosser 33 is connected to the input of inward bound amplifier 34, the output of which is applied through resistor 35 to a low-pass separation filter 36. The output of filter 36 is connected to winding 23 on transformer 14.

It can be seen that the arrangements described above separate the inward and outward bound signals by frequency and separately amplify each of these signals. Both the outward bound and the inward bound signals are subjected to automatic gain control as will be described hereinafter.

Gain control in the outward bound path 24 is obtained by connecting a portion of the output of amplifier 28 through resistor 40 to a weighting circuit 41. Weighting circuit 41 is a frequency dependent impedance which is chosen depending on the frequency characteristics of inward bound transmission line 10. The output of weighting circuit 41, appearing across resistor 42, is applied to a detector 43. Detector 43 rectifies the output from amplifier 28 to supply a rectified gain control signal through resistor 44 to one input of the direct current operational amplifier 45. The other input to operational amplifier 45 is a reference voltage from source 46 which sets a threshold at which the automatic gain control operation takes place. Below this threshold (where the signal from detector 43 is less than the reference signal from source 46) the automatic gain control circuit is inoperative. Feedback capacitor 47 connects the output of operational amplifier 45 to the control input at resistor 44 to provide long-term integration of the rectified control signal, removing the alternating current components. Once amplifier 45 is enabled, the direct current output is maintained at the level of voltage source 46.

The output of operational amplifier 45 is applied simultaneously to the base elecrodes of transistors 48 and 49. The emitter electrodes of transistors 48 and 49 are biased from voltage source 50 through biasing resistors 51 and 52, respectively. The collector electrode of transistor 48 is connected to variolosser 27 by way of lead 70 and provides the control signal for varying the attenuation introduced by variolosser 27 in response to the level of the signal transmitted through path 24. This average level feedback in transmission path 24 provides automatic gain control for the outward bound direction of transmission.

The collector electrode of transistor 49 is connected to the control input of variolosser 33 in inward bound transmission path 25. Thus, the average level of the outward bound signal is used to control the level of the inward bound signal by means of a control signal supplied by transistor 49. This control of the inward bound signal by the level of the outward bound signal is called "cross control" and serves the function of establishing an inward bound signal level which is automatically adjusted for the length of the inward bound transmission line 10. This arrangement makes it unnecessary to adjust the gain of amplifier 34 for each repeater installation and thus simplifies the installation of repeater lines and makes the levels received at the central office through a chain of repeaters maintain a predetermined value.

In accordance with the present invention, variolosser 33 is also under the control of the signal level in the inward bound transmission path 25. Thus, the output of amplifier 34 is connected across a voltage divider including resistors 55 and 56. The midpoint of resistors 55 and 56 is connected to a detector 57 similar to detector 43 which provides a rectified control signal through resistor 58 to one input of direct current operational amplifier 59. A capacitor 60 filters the alternating current components from the output of detector 57. The other input to direct current operational amplifier 59 is supplied through resistor 61 from voltage reference source 62. Thus, operational amplifier 59 does not become enabled until the signal on capacitor 60 exceeds the reference voltage supplied from source 62 through resistor 61.

The output of operational amplifier 59 is applied simultaneously to the base electrodes of transistors 63 and 64. The emitter electrodes of transistors 63 and 64 are biased from voltage source 65 through biasing resistors 66 and 67, respectively. The collector of transistor 63, like the collector of transistor 49, is connected to the control input of variolosser 33 and thus contributes to the automatic gain control signal for the inward bound transmission path 25. In this way, the gain of the inward bound transmission path 25 is set at a normal level by the level of the signal in outward bound path 24. Under exceptionally high input signals levels, however, the gain control signal from transistor 63 aids or assists the normal automatic gain control signal to prevent overloading of the components of amplifier 34. In this way, both overload protection and cross control are provided for the inward bound transmission path 25.

The collector of transistor 64 is connected to the reference input of operational amplifier 59. This connection provides negative feedback once amplifier 59 is enabled to control the output current level from transistor 63. This provides a negative feedback action once amplifier 59 produces an output, and establishes the amount of current in the collector of transistor 64 for a given input voltage to amplifier 59.

It will be noted that transistors 63 and 64 comprise a current mirror circuit in that the collector currents of transistors 63 and 64 are identical in magnitude. This arrangement permits the generation of a feedback current identical to the output current from transistor 63 without the necessity of sensing or otherwise loading the output current from transistor 63. The feedback signal derived by the current mirror circuit is therefore independent of any loading effects of variolosser 33 as well as independent of the parameters of any current sensing circuit. This arrangement permits the output of operational amplifier 59 to be controlled extremely accurately without any deleterious loading effect.

I claim:

1. A control circuit having two different output signals and comprising two amplifiers each having a different input signal characterized by a first current mirror comprising a pair of transistors connected in common at their base electrodes to the output of a first of said amplifiers, a second current mirror comprising a pair of transistors connected in common at their base elecrodes to the output of a second of said amplifiers, substantially identical resistances connected between the emitter electrodes of each pair and a common voltage, the collector from one transistor in the first current mirror providing one output signal, the collector from the other transistor in the first current mirror being connected to the collector from one transistor in the second current mirror for providing the second output signal, and the collector from the other transistor in the second current mirror being connected in a feedback path to a reference input of the second amplifier.

2. The control circuit according to claim 1 characterized in that said amplifier comprises a direct current operational amplifier.

* * * * *